United States Patent
Byeon

(10) Patent No.: US 9,892,778 B1
(45) Date of Patent: Feb. 13, 2018

(54) MEMORY DEVICE, MEMORY SYSTEM INCLUDING THE SAME, OPERATION METHOD OF THE MEMORY SYSTEM

(71) Applicant: SK hynix Inc., Gyeonggi-do (KR)

(72) Inventor: Sang-Jin Byeon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/380,404

(22) Filed: Dec. 15, 2016

(51) Int. Cl.
| | | |
|---|---|---|
| *G11C 11/406* | (2006.01) | |
| *G11C 11/4091* | (2006.01) | |
| *G11C 11/4096* | (2006.01) | |
| *G11C 11/408* | (2006.01) | |

(52) U.S. Cl.
CPC .... *G11C 11/40615* (2013.01); *G11C 11/4087* (2013.01); *G11C 11/4091* (2013.01); *G11C 11/4096* (2013.01)

(58) Field of Classification Search
CPC .......... G11C 11/406; G11C 2211/4065; G11C 11/40615; G11C 11/40618; G11C 2211/4062

USPC ........................................................ 365/222
See application file for complete search history.

(56) References Cited

U.S. PATENT DOCUMENTS

| | | | |
|---|---|---|---|
| 9,142,263 B2 | 9/2015 | Klein | |
| 2005/0152200 A1* | 7/2005 | Lee ........ | G11C 7/1045 365/222 |
| 2008/0037344 A1* | 2/2008 | Kobayashi ....... | G11C 7/12 365/203 |
| 2010/0246304 A1* | 9/2010 | Koshita ........ | G11C 8/04 365/222 |
| 2015/0155028 A1* | 6/2015 | Lee .......... | G11C 11/40615 365/222 |

* cited by examiner

*Primary Examiner* — Hoai V Ho
(74) *Attorney, Agent, or Firm* — IP & T Group LLP

(57) ABSTRACT

A memory system includes: a memory device suitable for performing a refresh operation in response to a refresh command, and for providing a refresh end signal where the refresh end signal is enabled before the refresh operation is completed; and a memory controller suitable for transferring the refresh command to the memory device and receiving the refresh end signal.

10 Claims, 7 Drawing Sheets

MEMORY DEVICE, MEMORY SYSTEM INCLUDING THE SAME, OPERATION METHOD OF THE MEMORY SYSTEM

BACKGROUND

1. Field

Exemplary embodiments of the present invention relate to a memory device and a memory system.

2. Description of the Related Art

A memory cell of a memory device may include a capacitor for storing data in the form of charges and a switch for controlling the flow of charges to and from the capacitor. Data stored in a memory cell may be a logic value of '1' (high level) or a logic value of '0' (low level) based on whether there are charges in the capacitor of the memory cell, in other words, whether the terminal voltage of the capacitor is high or lows.

To maintain the data stored in a memory cell it is critical to maintain the level of charges in the capacitor. Due to current leakage that may typically occur in a PN junction of a metal oxide semiconductor (MOS) transistor, the initial amount of charges stored in a capacitor may be reduced overtime, and thus the data may be lost. To prevent data from being lost, a memory system employs a refresh operation wherein the data which are stored in the memory cells are read periodically before the data gets lost, and then the memory cells are re-charged according to the read data.

A refresh operation of a memory device is performed in response to a refresh command provided from a memory controller, Typically, the memory controller may provide a subsequent valid command to the memory device after a predetermined amount of time has passed from the time that the memory controller applies a refresh command to the memory device. This time is known as tRFC (Refresh Cycle time) and is basically a predetermined period of time that is reserved for ensuring that a refresh operation is completely performed in response to a refresh command. Typically, a TRFC for a memory device is set to be quite longer than the actual time of the refresh operation.

FIG. 1 is a timing diagram illustrating a conventional refresh operation in a memory system. Referring to FIG. 1, when the memory controller applies a refresh command REF to the memory device at a time '101', the memory device may perform a refresh operation till a time '102' in response to the refresh command REF. Theoretically, a subsequent operation could be performed after the refresh operation has been completed, i.e., aftertime '102', However, in practice, the memory controller does not know whether the memory device has completed the refresh operation, and the memory controller directs a subsequent operation of the memory device by applying a subsequent valid command VALID_CMD after a time '103', which is the predetermined tRFC time for the memory device after the time '101' of the refresh command REF. It can be seen therefore, that there exists a time period during which the memory device stays idle without any operation during the tRFC time even though the refresh operation has been completed and the memory device is available.

SUMMARY

Embodiments of the present invention are directed to a memory device, memory system and method for reducing the time loss that a memory device stays idle during a refresh operation.

In accordance with an embodiment of the present invention, a memory system includes: a memory device suitable for performing a refresh operation in response to a refresh command, and for providing a refresh end signal where the refresh end signal is enabled before the refresh operation is completed; and a memory controller suitable for transferring the refresh c and to the memory device and receiving the refresh end signal.

The memory controller may apply a subsequent command to the memory device only after the refresh end signal is received by the memory controller.

The subsequent command may include at least one of an active command, a read command, a write command, the refresh command, and a setting command.

A time gap between a time when the refresh operation is completed and a time when the refresh end signal is enabled may be controllable.

The memory device adjusts the provision of the refresh end signal so that a time gap between the completion of the refresh operation and the provision of the subsequent operation command is adjusted.

The memory device may include: a refresh circuit suitable for generating a row active signal for the refresh operation in response to the refresh command; an end signal generating circuit suitable for generating the refresh end signal by delaying the row active signal; and an end signal transferring circuit suitable for providing the refresh end signal to the memory controller.

The end signal generating circuit may include: a pulse signal generator suitable for generating a pulse signal upon the generation of the row active signal; and a delayer suitable for generating the refresh end signal by delaying the pulse signal.

A delay value of the delayer may be adjusted so that a time gap between the completion of the refresh operation and the provision of the operation command is adjusted.

The memory device may perform the refresh operation while the row active signal is enabled, and the end signal generating circuit may adjustably generate the refresh end signal before the row active signal is disabled so that a time gap between the completion of the refresh operation and the provision of the operation command is adjusted.

In accordance with another embodiment of the present invention, a memory device includes: a refresh circuit suitable for generating a row active signal in response to a refresh command; an end signal generating circuit suitable for generating a refresh end signal by delaying the row active signal; and an end signal transferring circuit suitable for transferring the refresh end signal.

The end signal generating circuit may include: a pulse signal generator suitable for generating a pulse signal enabled when the row active signal is enabled; and a delayer suitable for generating the refresh end signal by delaying the pulse signal.

The delay value of the delayer may be adjusted in response to a delay setting signal.

The refresh circuit further ay generate a counting address in response to the refresh command, wherein the memory device further includes a cell array and memory cells of the cell array are selected according to the counting address, and are refreshed while the row active signal is enabled.

The refresh end signal may be enabled before the row active signal is disabled.

In accordance with yet another embodiment of the present invention, a method for operating a memory system including a memory controller and a memory device, the method may include: providing, by the memory controller, a refresh command to the memory device; performing, by the memory device, a refresh operation in response to the refresh command; providing, by the memory device, an enabled refresh end signal to the memory controller before the refresh operation is completed; and directing by the memory controller, an operation of the memory device subsequent to the refresh operation upon reception of the enabled refresh end signal.

The directing of the operation of the memory device may be performed after completion of the performing of the refresh operation.

The subsequent operation of the memory device may include at least one of an active operation, a read operation, a write operation, and a setting operation.

BRIEF DESCRIPTION OF THE DRAWINGS

The above and other features and advantages of the present invention will become more apparent to those skilled in the art to which the present invention pertains by the following detailed description with reference to the attached drawings in which.

DETAILED DESCRIPTION

Figure 1:
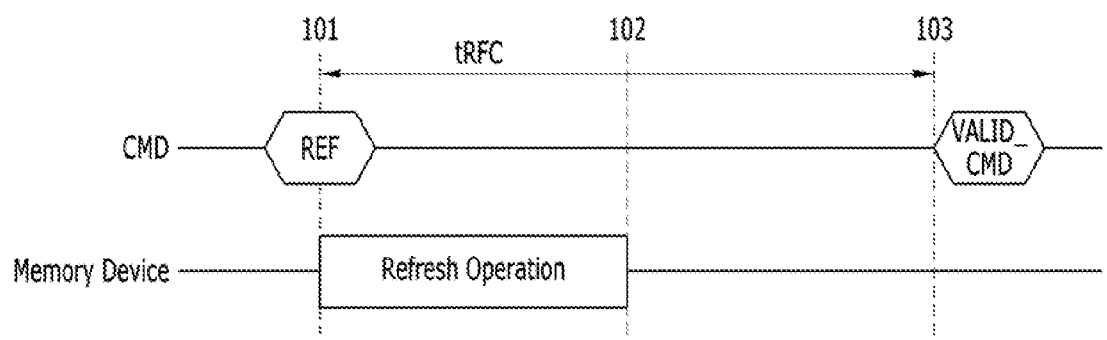
FIG. 1 is a timing diagram illustrating a conventional refresh operation in a memory system.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the present invention to those skilled in the art to which the present invention pertains.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to more dearly illustrate the various elements of the embodiments. For example, in the drawings, the size of elements and the intervals between elements may be exaggerated compared to actual sizes and intervals for convenience of illustration.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms are intended to include the plural forms as well, unless the context clearly indicates otherwise. It will be further understood that the terms "comprises," "comprising," "includes", and "including" when used in this specification specify the presence of the stated elements and do not preclude the presence or addition of one or more other elements.

As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

Throughout the disclosure, like reference numerals refer to like parts throughout the various figures and embodiments of the present invention.

Figure 2:
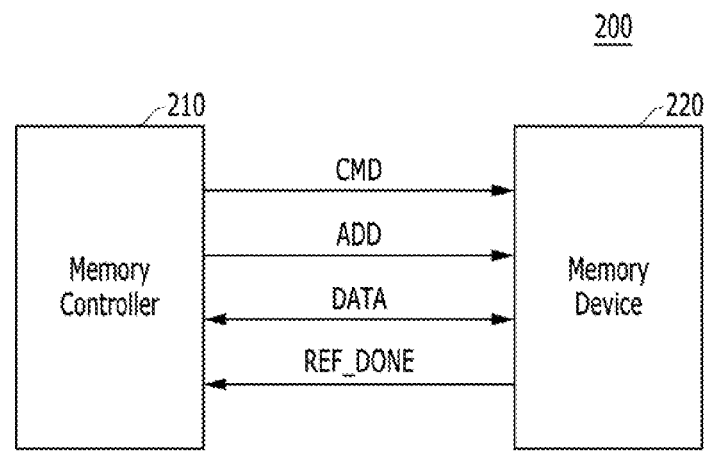
FIG. 2 is a block diagram illustrating a memory system accordance with an embodiment of the present invention.

Referring now to FIG. 2 a memory system 200 is provided in accordance with an embodiment of the present invention.

Referring to FIG. 2, the memory system 200 may include a memory controller 210 and a memory device 220 operatively coupled to one another.

The memory controller 210 may control the operation of the memory device 220, The memory controller 210 may, for example, provide a command CMD and an address ADD to the memory device 220, and exchange data DATA with the memory device 220 during a read operation and a write operation. The command CMD may include an active command, a precharge command, a read command, a write command, a refresh command, a setting command, and the like. The setting command or a Mode Register Set (MRS) command may control the memory device 220 to perform diverse setting operations. The memory controller 210 may periodically transfer the refresh command to the memory device 220 to prevent loss of the data stored in the memory device 220.

The memory device 220 may perform an operation such as an active operation, a precharge operation a read operation, a write operation, a refresh operation and the like, under the control of the memory controller 210

The memory device 220 may perform a refresh operation in response to a refresh command received from the memory controller 210. At the end of the refresh operation, the memory device 220 may then inform the memory controller 210 of the end of the refresh operation by generating and transmitting a refresh end signal REF_DONE to the memory controller 210.

Figure 3:
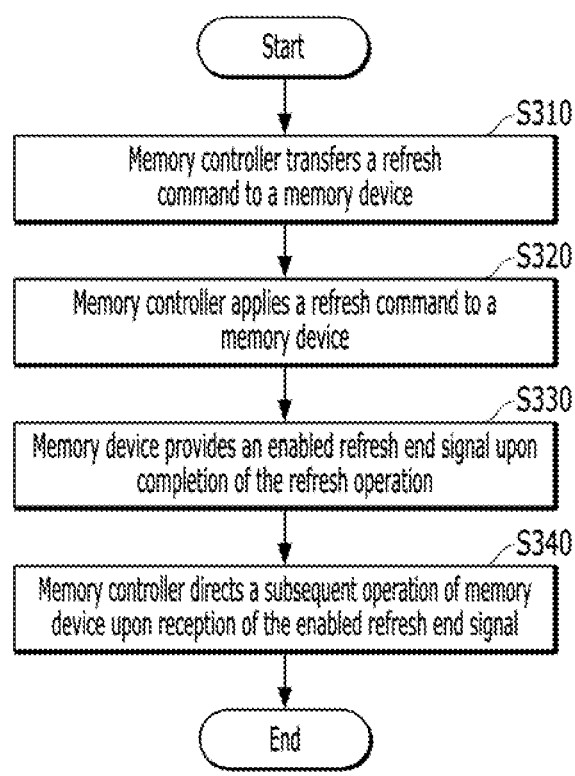
FIG. 3 is a flowchart of an operation of the memory system shown in FIG. 2 in accordance with an embodiment of the present invention.
Figure 4:
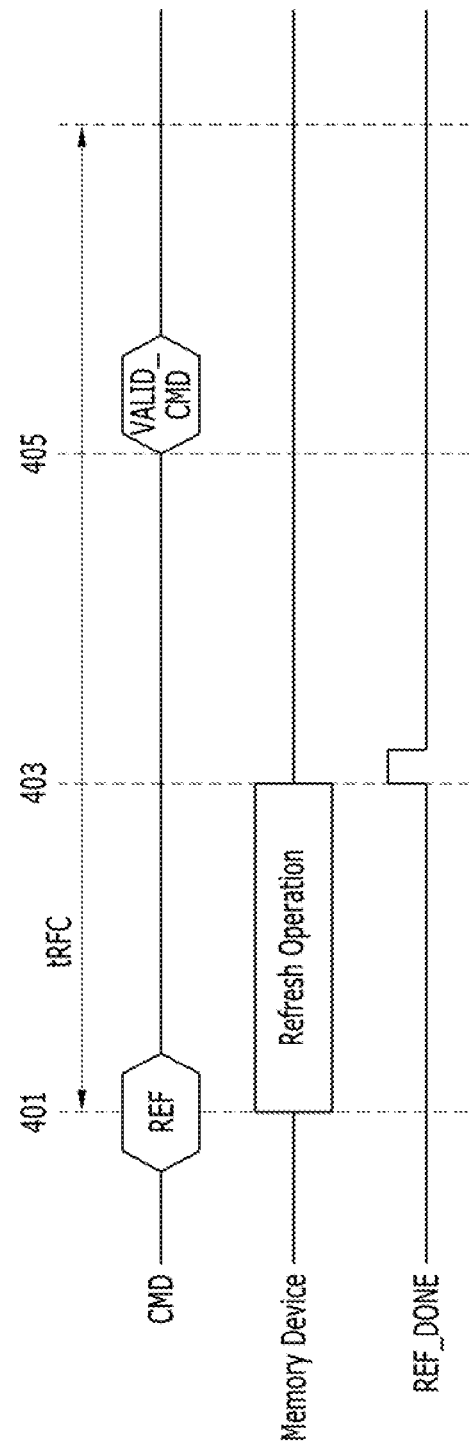
FIG. 4 is a timing diagram describing the operation of FIG. 3.

FIG. 3 is a flowchart of an operation of the memory system 200, in accordance with an embodiment of the present invention. FIG. 4 is a timing diagram describing the operation of FIG. 3.

Referring now to FIGS. 3 and 4, the operation includes, at, step S310 the memory controller 210 transferring a refresh command REF to the memory device 220 at a time '401'.

At step S320, the memory device 220 performs a refresh operation in response to the refresh command REF. The refresh operation is completed at a time '403'.

At step S330 at the time '403' when the memory device 220 completes the refresh operation, the memory device 220 ends the refresh operation and enables a refresh end signal REF_DONE.

Then at step S340, at a time '405,' upon reception of the enabled refresh end signal REF_DONE, the memory controller 210 directs a subsequent operation by applying a valid command VALID_CMD to the memory device 220. The subsequent operation may include at least one of an active operation, a read operation, a write operation, and a setting operation.

Referring to FIG. 4, a predetermined time segment or the tRFC reserved for the refresh operation of the memory device 220 starts at the time '401' of the refresh command REF and ends after the time 405. Unlike the prior art of FIG. 1, the memory device 220 informs the memory controller 210 of the end of the refresh operation through the refresh end signal REF_DONE, and the memory controller 210 may then apply a valid command VALID_CMD for the subsequent operation before the end of the Trfc. Therefore, the time wastefully consumed by the refresh operation may be reduced substantially while at the same ensuring the proper completion of the refresh operation.

As illustrated in FIG. 4, a time gap exists between the time '403' when the refresh operation of the memory device 220 is completed and the time '405' when the memory controller 210 applies the valid command VALID_CMD for the subsequent operation of the memory device 220. This time gap is reserved for a signal propagation delay of the refresh end signal REF_DONE, a time for the memory controller 210 to respond to the refresh end signal REF_DONE, and a signal propagation delay of the valid command VALID_CMD for the subsequent operation.

Figure 5:
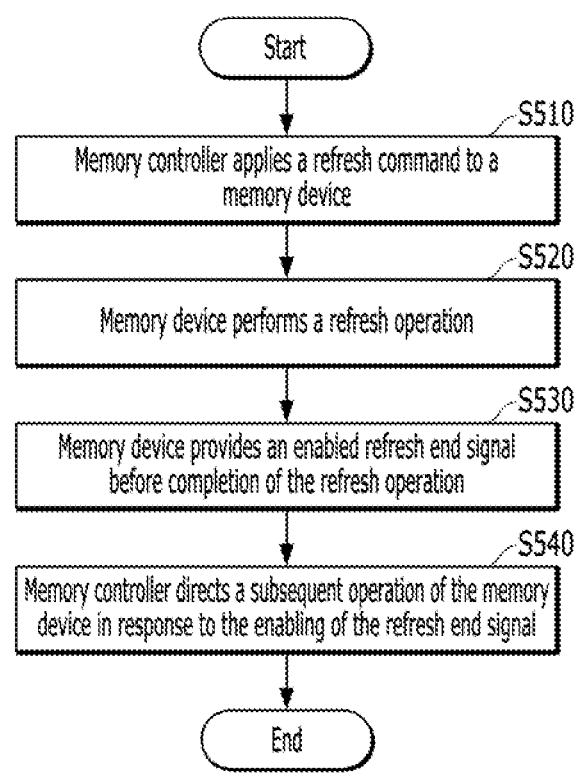
FIG. 5 is a flowchart of an operation of the memory system shown in FIG. 2 in accordance with another embodiment of the present invention.
Figure 6:
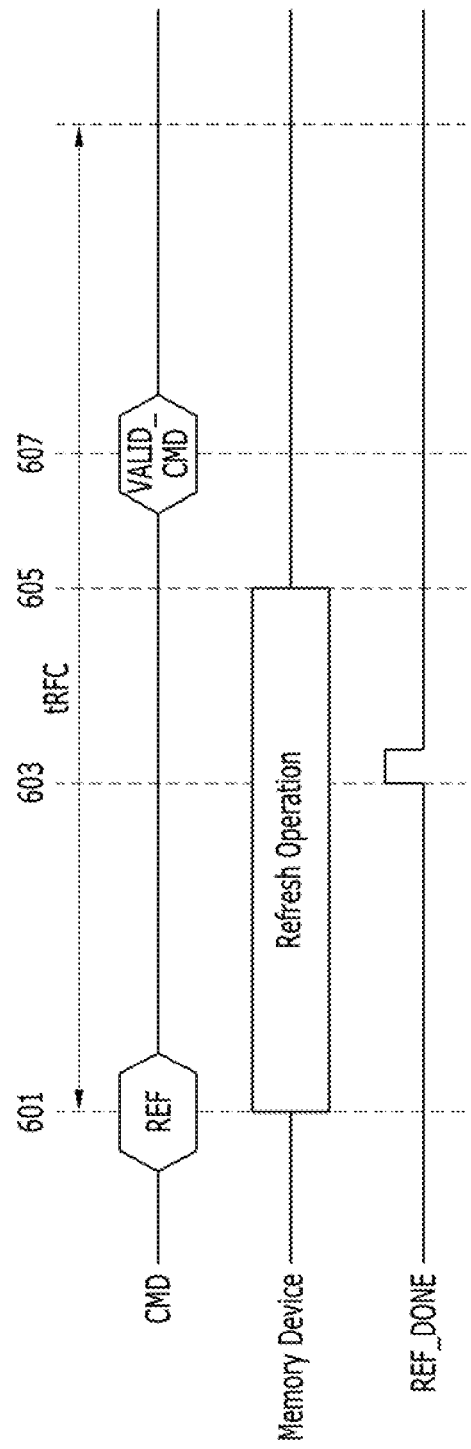
FIG. 6 is a timing diagram describing the operation of FIG. 5.

FIG. 5 is a flowchart of an operation of the memory system 200, in accordance with another embodiment of the present invention, and FIG. 6 is a timing diagram describing the operation of FIG. 5.

Referring to FIGS. 5 and 6, at step S510, the memory controller 210 transfers a refresh command REF to the memory device 220, The refresh command may be applied to the memory device at a time '601'.

At step S520, the memory device 220 then performs a refresh operation in response to the refresh command REF. The refresh operation may be completed at a time '605'

At step S530, the memory device 220 enables a refresh end signal REF_DONE before the refresh operation is completed. As illustrated in FIG. 6, the memory device may enable the refresh end signal REF_DONE at a time '603' which is before the time "605" at which the memory device 220 completes the refresh operation, Hence, unlike the embodiment of FIGS. 3 and 4, wherein the memory device 220 provides the enabled refresh end signal REF_DONE after the memory device 220 completes the refresh operation, in the embodiment of FIGS. 5 and 6 the memory device 220 provides the enabled refresh end signal REF_DONE before the memory device 220 completes the refresh operation.

At step S540, upon reception of the enabled refresh end signal REF_DONE, the memory controller 210 directs a subsequent operation of the memory device 220 in response to the enabling of the refresh end signal by applying a valid command VALID_CMD to the memory device 220 at a time '607'. Although the enabled refresh end signal REF_DONE is provided to the memory controller 210 before the refresh operation of the memory device 220 is completed, i.e., at the time '603' which is before the time '605', the time "607" at which the memory controller 210 directs the subsequent operation of the memory device 220 is after the time "605" that the refresh operation of the memory device 220 is completed. The time gap between the time '603' and the time '607' is the same as the time gap between the times '403' and '405' described with reference to FIGS. 3 and 4. However, the time gap between the time "605" at which the refresh operation is completed and the time "607" at which the valid command VALID_CMD is applied to the memory device 220 is now further reduced.

Referring to FIGS. 4 and 6, it may be seen in the embodiment of FIG. 4 that the refresh end signal REF_DONE is enabled at the time '403' when the refresh operation is completed and thus the time gap between the time '403' is completed and the time '405' is relatively longer compared to the embodiment of FIG. 6. On the other hand, it may be seen in the embodiment of FIG. 6 that the refresh end signal REF_DONE is enabled at the time '603', which is before the time '605' when the refresh operation is completed, and the time gap between the times '605' and '607' is relatively shorter. Hence, the embodiment of FIGS. 5 and 6 further reduces time loss in the time gap between the completion of the refresh operation and the subsequent operation of the memory device 22.

Figure 7:
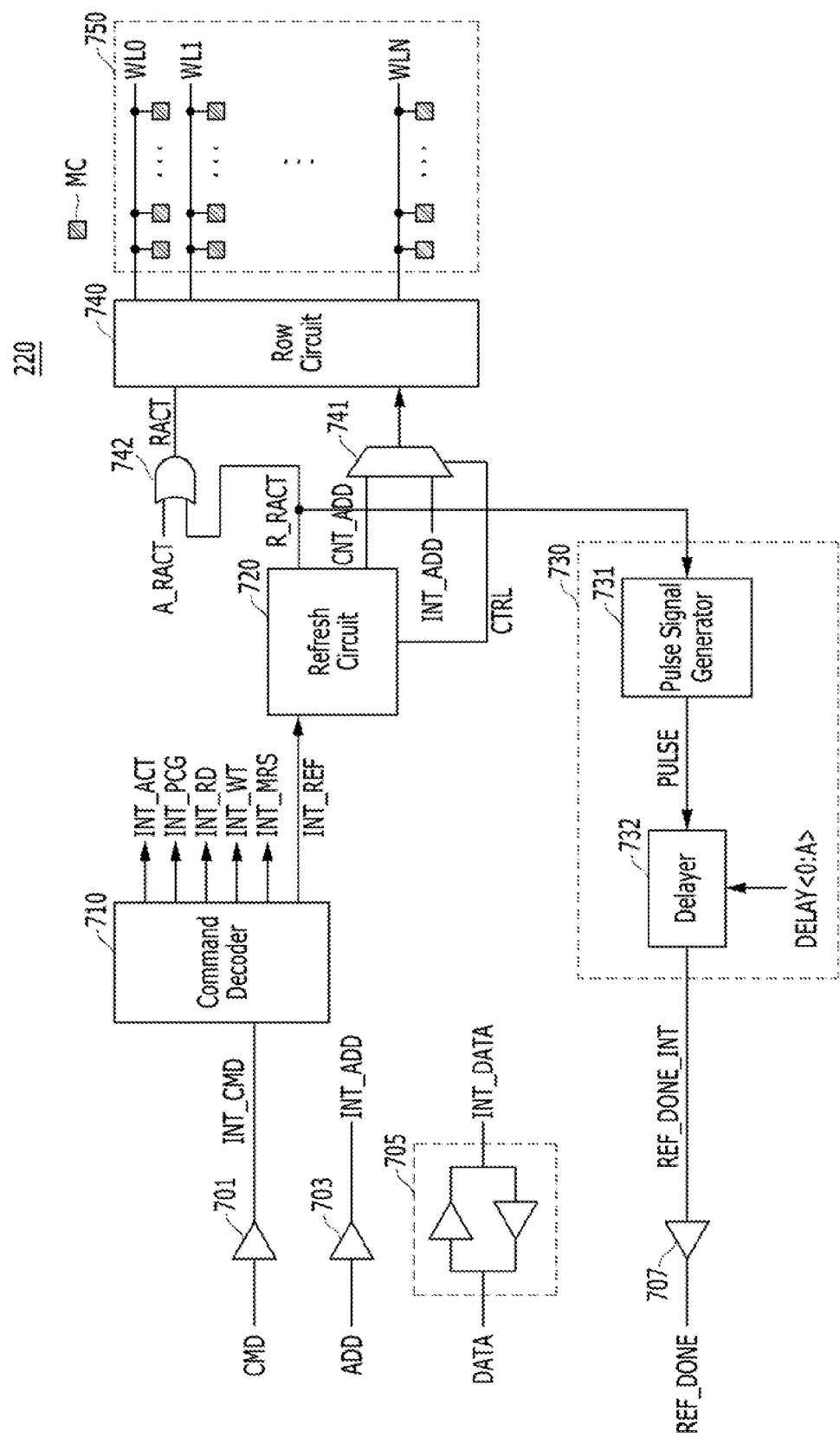
FIG. 7 is a block diagram illustrating a memory device 220 shown in FIG. 2.

FIG. 7 is a block diagram illustrating a detailed configuration for the memory device 220 shown in FIG. 2, according to an embodiment of the present invention.

Referring to FIG. 7, the memory device 220 may include a command receiving circuit 701, an address receiving circuit 703, a data transferring/receiving circuit 705, an end signal transferring circuit 707, a command decoder 710, a refresh circuit 720, an end signal generating circuit 730, a row circuit 740, and a cell array 750. FIG. 7 shows structures related to a refresh operation and the generation of a refresh end signal in the memory device 220.

The cell array 750 may include a plurality of word lines WL0 to WLN (where N is an integer equal to or greater than 1), Each of the word lines WL0 to WLN may be coupled with one or more memory cells MC. The cell array may be a 2-dimensional array. The cell array may be a three-dimensional array. Each memory cell may be a single bit cell or a multi bit cell.

The command receiving circuit 701 may receive a command CMD provided from the memory controller 210 and transfer it as command INT_CMD to the command decoder 710. The address receiving circuit 703 may receive an address ADD provided from the memory controller 210. The address ADD may indicate a memory location where data are to be stored in a write operation or from where data are to be read in a read operation. The command CMD and the address ADD may include multi-bit signals. The data transferring/receiving circuit 705 may receive data DATA provided from the memory controller 210 such as write data to be stored in the memory device according to the received address ADD in a write operation, or may transfer data DATA which are read from the memory device to the memory controller 210 in a read operation. The data transferring/receiving circuit 705 may receive data DATA in a write operation, and transfer data DATA in a read operation.

The command decoder 710 may generate at least one of an internal active command INT_ACT, an internal refresh command INT_REF, an internal precharge command INT_PCG, an internal read command INT_RD, an internal write command INT_WR, and an internal setting command INT_MRS by decoding an internal command INT_CMD received through the command receiving circuit 701.

The refresh circuit 720 may generate a row active signal R_RACT and a counting address CNT_ADD in response to the refresh command REF applied from the memory controller 210, more specifically, in response to the enabling of the internal refresh command INT_REF. The counting address CNT_ADD is an address for selecting a word line to be refreshed among the word lines WL0 to WLN. The counting address CNT_ADD may be changed whenever the internal refresh command INT_REF is enabled in order to select a new counting address corresponding to another word line according to one of a plurality of well-known schemes. The row active signal R_RACT is a signal for refreshing the corresponding word line by enabling a word line selected according to the counting address CNT_ADD. The row active signal R_RACT may be enabled for a predetermined time after the internal refresh command INT_REF is enabled.

A selector 741 may transfer the counting address CNT_ADD generated in the refresh circuit 720 to the row circuit 740 during a refresh operation. The selector 741 may be used to transfer the counting address CNT_ADD generated in the refresh circuit 720 to the row circuit 740 during other operations. The selector 741 may transfer an internal address INT_ADD received through the address receiving circuit 703 to the row circuit 740, The selection operation of the selector 741 may be controlled in response to a control signal CTRL generated in the refresh circuit 720.

The row circuit 740 may enable a word line selected according to an address provided by the selector 741 among the word lines WL0 to WLN when a row active signal RACT is enabled, A row active signal A_RACT is a row active signal enabled when the internal active command INTACT is enabled during an active operation. The row active signal R_RACT is a row active signal enabled during a refresh operation. The row active signal RACT inputted to the row circuit 740 is generated as the row active signal A_RACT and the row active signal R_RACT are combined in an OR gate 742. Therefore, when one signal between the row active signal A_RACT and the row active signal R_RACT is enabled, the row active signal RACT may be enabled and provided to the row circuit 740. During the refresh operation, the memory cells MC that are coupled to an enabled word line may be refreshed.

The end signal generating circuit 730 may generate a refresh end signal REF_DONE_INT by delaying the row active signal R_RACT. The end signal transferring circuit 707 may then output the refresh end signal REF_DONE_INT as the refresh end signal REF_DONE. The end signal generating circuit 730 may include a pulse signal generator 731 and a delayer 732. The pulse signal generator 731 may generate a pulse signal PULSE that is enabled when the row active signal R_RACT is enabled. The delayer 732 may generate the refresh end signal REF_DONE_INT by delaying the pulse signal PULSE received from the pulse signal generator 731

The delay value of the delayer 732 may be adjusted in response to a delay setting signal DELAY<0:A> (where A is an integer equal to or greater than 1). The delay setting signal DELAY<0:A> may control the enabling timing of the refresh end signal REF_DONE_INT. The logic values of the delay setting signal DELAY<0:A> may be decided according to the MRS setting, or values stored in a fuse circuit within the memory device 220. As the delay value of the delayer 732 is increased, the time interval between the time when the refresh end signal REF_DONE_INT is enabled and the time when the refresh operation is completed may become longer. As the delay value of the delayer 732 is decreased, the time interval between the time when the refresh end signal REF_DONE_INT is enabled and the time when the refresh operation is completed may become shorter.

When a distance between the memory device 220 and the memory controller 210 is long, the delay value of the delayer 732 may be set to be short. When the distance between the memory device 220 and the memory controller 210 is short, the delay value of the delayer 732 may be set to be long. This is because the time required for the refresh end signal REF_DONE, which is delayed from the refresh end signal REF_DONE_INT as described later, to be provided to the memory controller 210 depends on the distance between the memory device 220 and the memory controller 210.

Figure 8:
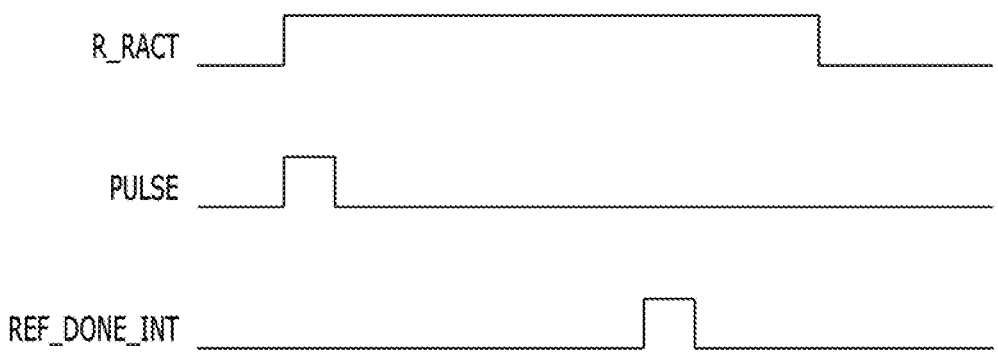
FIG. 8 is a timing diagram illustrating an operation of an end signal generation circuit shown in FIG. 7.

FIG. 8 is, a timing diagram illustrating an operation of the end signal generating circuit 730.

Referring to FIG. 8, the pulse signal PULSE may be enabled by the pulse signal generator 731 at a time when the row active signal R_RACT is enabled and the refresh end signal REF_DONE_INT may be generated as the pulse signal PULSE is delayed in the delayer 732, The time gap between the enablement of the pulse signal PULSE and the time of the enablement of the refresh end signal REF_DONE_INT, which is the delay value of the delayer 732, may be controlled according to the delay setting signal DELAY<0:A>.

The end signal transferring circuit 707 may delay the refresh end signal REF_DONE_INT from the end signal generating circuit 730 to generate and provide the refresh end signal REF_DONE to the memory controller 210. The end signal transferring circuit 707 may operate in a synchronous or an asynchronous manner with a clock (not shown). The refresh end signal REF_DONE may be provided to the memory controller 210 through one line among the lines for transferring the addresses ADD, the commands CMD, and the data DATA.

According to the embodiments of the present invention, it is possible to reduce the time that is wastefully spent during a refresh operation in a memory system.

While the present invention has been described with respect to specific embodiments, it will be apparent to those skilled in the art that various changes and modifications may be made without departing from the spirit and scope of the invention as defined in the following claims.

What is claimed is:

1. A memory system, comprising:
 a memory device suitable for performing a refresh operation in response to a refresh command, and for generating a refresh end signal; and
 a memory controller suitable for transferring the refresh command to the memory device and receiving the refresh end signal from the memory device,
 wherein the memory controller is informed of completion of the refresh operation of the memory device from the refresh end signal that is generated to be enabled before the refresh operation is completed in the memory device,
 wherein a time gap between a time when the refresh operation is completed and a time when the refresh end signal is enabled is controllable, and
 wherein the memory device adjusts the provision of the refresh end signal so that a time gap between the completion of the refresh operation and the provision of the subsequent operation command is adjusted.

2. The memory system of claim 1, wherein the memory controller applies a subsequent command to the memory device only after the refresh end signal is received by the memory controller.

3. The memory system of claim 2, wherein the subsequent command includes at least one of an active command, a read command, a write command, the refresh command, and a setting command.

4. The memory system of claim 1, wherein the memory device includes:
 a refresh circuit suitable for generating a row active signal for the refresh operation in response to the refresh command;
 an end signal generating circuit suitable for generating the refresh end signal by delaying the row active signal; and
 an end signal transferring circuit suitable for providing the refresh end signal to the memory controller.

5. The memory system of claim 4, wherein the end signal generating circuit includes:
 a pulse signal generator suitable for generating a pulse signal upon the generation of the row active signal; and
 a delayer suitable for generating the refresh end signal by delaying the pulse signal.

6. The memory system of claim 5, wherein a delay value of the delayer is adjusted so that a time gap between the completion of the refresh operation and the provision of the operation command is adjusted.

7. The memory system of claim 6,
 wherein the memory device performs the refresh operation while the row active signal is enabled, and
 wherein the end signal generating circuit adjustably generates the refresh end signal before the row active signal is disabled so that a time gap between the completion of the refresh operation and the provision of the operation command is adjusted.

8. A method for operating a memory system including a memory controller and a memory device, the method comprising:
 providing, by the memory controller, a refresh command to the memory device;
 performing, by the memory device, a refresh operation in response to the refresh command;
 providing, by the memory device, a refresh end signal to the memory controller, wherein the refresh end signal is generated to be enabled before the refresh operation is completed in the memory device; and
 directing, by the memory controller, an operation of the memory device subsequent to the refresh operation upon reception of the enabled refresh end signal.

9. The method of claim 8, wherein the directing of the operation of the memory device is performed after completion of the performing of the refresh operation.

10. The method of claim 8, wherein the subsequent operation of the memory device includes at least one of an active operation, a read operation, a write operation, and a setting operation.

* * * * *